United States Patent [19]

Le

[11] Patent Number: 5,995,735
[45] Date of Patent: Nov. 30, 1999

[54] DIRECTIONAL REPEATER PHYSICAL ASSIGNMENT AND CONNECTION FOR HIGH-PERFORMANCE MICROPROCESSORS

[75] Inventor: Khanh M Le, San Jose, Calif.

[73] Assignee: Sun Microsystems, Inc., Palo Alto, Calif.

[21] Appl. No.: 08/876,131

[22] Filed: Jun. 23, 1997

[51] Int. Cl.$^6$ .................................................. G06F 17/50
[52] U.S. Cl. ................................. 395/500.14; 395/500.07
[58] Field of Search ........................... 395/500.14, 500.11, 395/500.07; 364/488, 489, 491, 490, 578

[56] References Cited

U.S. PATENT DOCUMENTS

| | | | |
|---|---|---|---|
| 5,410,491 | 4/1995 | Minami | 364/491 |
| 5,557,779 | 9/1996 | Minami | 395/500 |
| 5,838,580 | 11/1998 | Srivatsa | 364/489 |
| 5,838,581 | 11/1998 | Kuroda | 364/491 |

*Primary Examiner*—Kevin J. Teska
*Assistant Examiner*—Leigh Marie Garbowski
*Attorney, Agent, or Firm*—Townsend and Townsend and Crew LLP

[57] ABSTRACT

An improved method for routing interconnect lines in a VLSI chip using repeaters. First, an optimal virtual assignment of the repeater locations is determined according to a suitable method. The "virtual" assignment is the ideal location irrespective of where logic blocks which could form a repeater cell might located. Next, repeaters are assigned to physical locations close to the optimal virtual locations. Finally, an optimal global routing is done using the physical locations of the repeaters. The optimal global routing revises the original global routing upon which the original optimal virtual assignment of repeaters was done. Preferably, blocks of circuitry and routing channels are identified first. Instead of simply routing the interconnect lines through the channels, a portion of the interconnect lines are routed through available spaces in the blocks themselves. This will reduce the number of turns required both through the channels and to reach a repeater. By routing through the blocks, repeaters can be placed at the entry or exit point on the block, eliminating the need for providing L or U-turns to a repeater from a channel.

10 Claims, 4 Drawing Sheets

DIRECTIONAL REPEATER PHYSICAL ASSIGNMENT AND CONNECTION FOR HIGH-PERFORMANCE MICROPROCESSORS

BACKGROUND OF THE INVENTION

The present invention relates to repeater cells in very large scale integration (VLSI) circuits, and in particular to the optimum placement and routing to and from such repeater cells.

In today's high frequency VLSI chips, delays through both active gates and wires have become equally important in determining the total critical path delay. As process technology and supply voltage are scaled, the active gate delay comes down quickly. The gate delay can fall into the sub nano-second range easily with today's advanced processes and scaled supply voltages. On the other hand, wire delay does not scale well due to the increased coupling capacitance and the increased series resistance in finer wires.

The use of repeaters or buffers in long wires can alleviate this delay problem. The RC time constant of a long wire follows the square rule with its length. Doubling the wire length quadruples the delay time at the end of the wire. On the other hand, the delay is only doubled when compared to the original wire delay (plus any added repeater gate delay) with the insertion of a repeater at the mid-point. This is an improvement in delay time when compared to the case without the use of repeaters.

Repeaters have been commonly used in high frequency chip design to resolve the long wire delay problem. The procedure can be described as follows: with an existing routed chip, all long signal wires are analyzed and identified for critical nets. This can be done using a SPICE program to simulate the signal net with the proper lumped or distributed RC model. Once repeater placement is identified, they can be inserted in the signal line where they are needed. The repeater cell can reside in a standard cell block, in a data path block, or in a stand-alone repeater block. However, they all occupy extra spaces in the layout.

In a high frequency VLSI chip running above 500 Mhz the required number of repeaters is quite significant. It was estimated that more than 15,000 repeaters are needed for a chip with die size of 18 mm×18 mm, compared to a few hundred for a 200 MHz or less chip. Also, the estimated wire distance between each repeater is about 4 mm.

The repeaters are essentially dedicated buffers which can be located at different positions on the chip. When a repeater is needed, the wire position where it is needed is broken and routed to the repeater and back. Depending on how close the repeater block happens to be, this additional wire routing can add additional delays.

SUMMARY OF THE INVENTION

The present invention provides an improved method for routing interconnect lines in a VLSI chip using repeaters. First, an optimal virtual assignment of the repeater locations is determined according to a suitable method. The "virtual" assignment is the ideal location irrespective of where logic blocks which could form a repeater cell might located. Next, repeaters are assigned to physical locations close to the optimal virtual locations. Finally, an optimal global routing is done using the physical locations of the repeaters. The optimal global routing revises the original global routing upon which the original optimal virtual assignment of repeaters was done.

Preferably, blocks of circuitry and routing channels are identified first. Instead of simply routing the interconnect lines in the channels, a portion of the interconnect lines are routed through available spaces in the blocks themselves. This will reduce the number of turns required both through the channels and to reach a repeater. By routing through the blocks, repeaters can be placed at the entry or exit point on the block, eliminating the need for providing L or U-turns to a repeater from a channel.

Preferably, the repeaters are assigned in arrays of repeater cells near the edges of the blocks. The repeater cells can have inputs and outputs arranged East-West, North-South or vice versa. The direction of the I/O connections of the repeaters cells is determined in accordance with the signal direction of the interconnect line. This additionally minimizes the number of turns required in the interconnect lines. By placing the repeater cell arrays near where high concentrations of desired virtual repeater assignments are located, critical interconnect lines are guaranteed to have repeaters at the best possible intervals.

For a further understanding of the nature and advantages of the invention, reference should be made to the following description taken in conjunction with the accompany drawings.

DESCRIPTION OF THE PREFERRED EMBODIMENT

Figure 1:
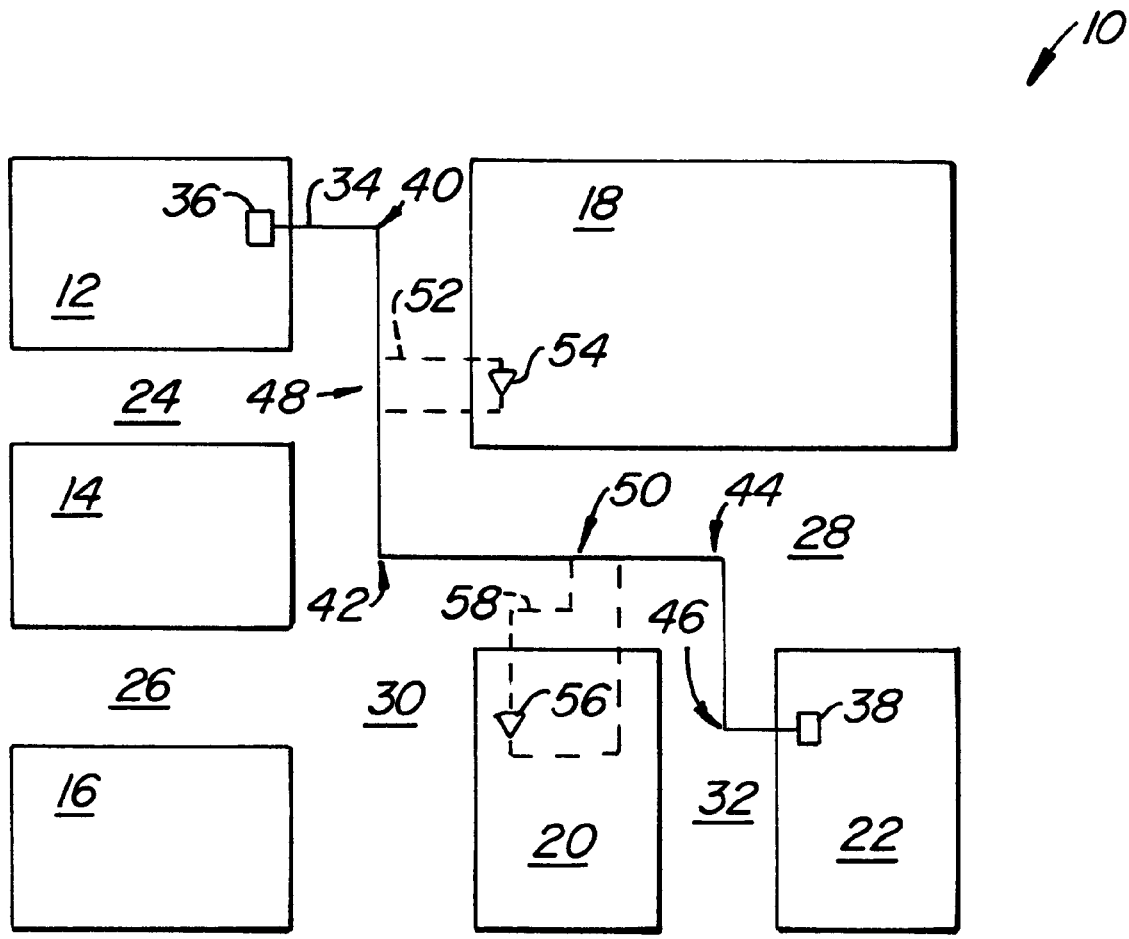
FIG. 1 is a diagram of an illustrative VLSI chip with circuit blocks and channels, illustrating interconnect routing and repeater placement according to the prior art.

FIG. 1 illustrates an example of a VLSI chip 10 having a number of blocks of circuitry 12, 14, 16, 18, 20 and 22. In between the blocks are horizontal channels 24, 26, and 28 and vertical channels 30 and 32. The blocks would typically contain groupings of circuitry, such as a data or instruction cache, an execution unit, etc. Typically, in a microprocessor, the block and channel layout would be much more complex, but a simple version is shown in the figures for illustrating the present invention.

As shown in FIG. 1, an interconnect line 34 progresses from a driver 36 in block 12 to a receiver 38 in block 22. As can be seen, interconnect line 34 makes four L-shaped turns 40, 42, 44, and 46. In addition, the interconnect line might require, for example, two repeaters. Typically, a repeater is found in some dedicated block of logic, or by other placement. For example, repeaters may be desired at locations 48 and 50, requiring additional routing lines such as routing lines indicated by dotted lines 52 from location 48. In this instance, a repeater cell 54 may be located nearby, requiring a simple U connection from interconnect line 34. Alternately, a closest repeater for location 50 may be some distance away, such as repeater 56, connected by dotted line 58 to location 50. As can be seen, if the orientation of repeater 56 is not optimal, it may require additional turns in an interconnection line.

It should be appreciated that interconnect line 34 might be one of dozens of lines in a bus, such as, for example, a 64 bit or even 128 bit internal data bus. With such a large grouping of lines, an L-shaped turn dramatically increases the interconnect distance, especially for signal lines farther away from the inside point of the turn. Similarly, a U-shaped turn can be thought of as two L turns, requiring a similar additional interconnect links beyond that of the distance to go from the turn to the repeater. In addition, a U-shaped turn will also require additional routing length or vias to another metal layer to avoid inside lines from crossing over outside lines as they go into a repeater and back around the U. As the number of signal lines and the clock speeds increase, and device sizes decrease, the penalties for the additional routing required in the example of FIG. 1 increase dramatically.

Accordingly, the present invention provides an improved method and apparatus for determining optimum repeater locations and routing interconnect lines through those repeater locations. First, shown in FIG. 1, the layout of the chip is determined, including the location of the blocks 12–22 and the channels 24–32. A global interconnect routing model can be generated using any number of existing prior art methods. From such a routing model, the ideal or "virtual" repeater locations can be determined using an appropriate method, either manual or automated. One example of an automated method is set forth in copending application Ser. No. 08/880,630, entitled Repeater Insert for VLSI Circuits Using Distributed Impedance Model, which is incorporated herein by reference.

Figure 2:
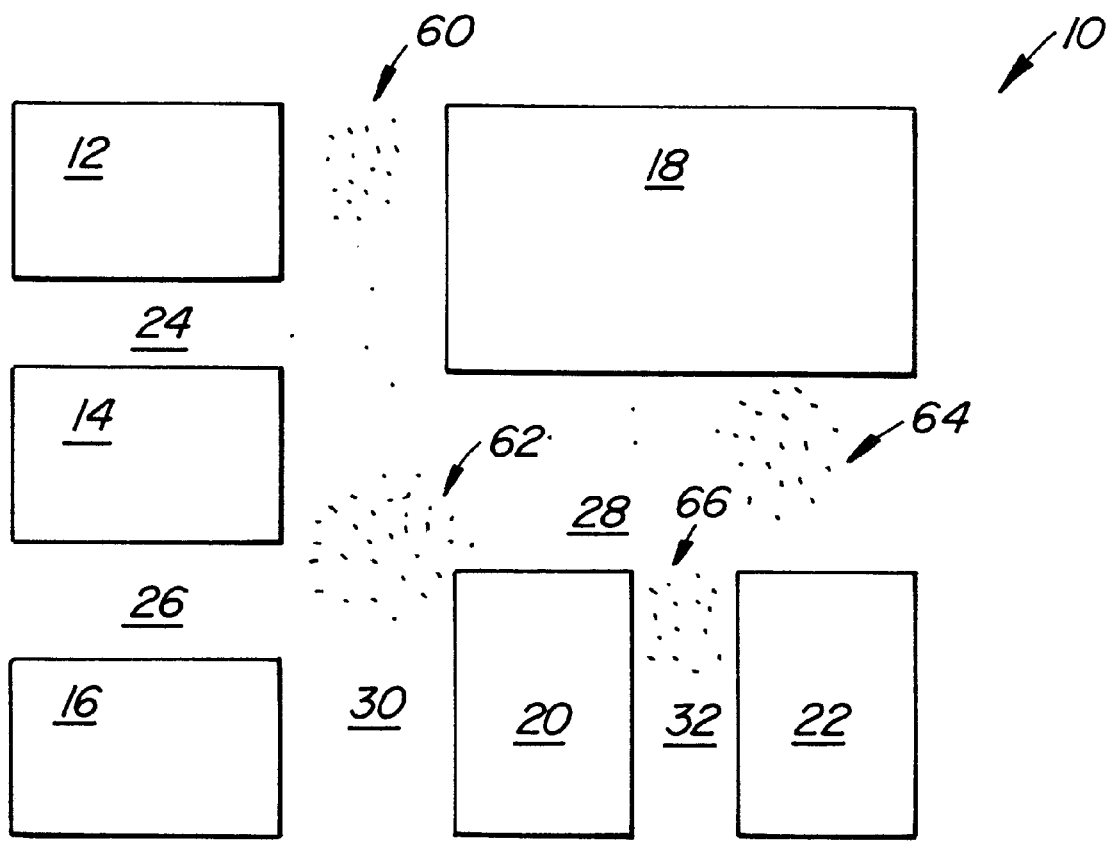
FIG. 2 is a diagram of a chip according to FIG. 1 showing virtual repeater assignments according to a first step of the present invention.

Such a virtual repeater assignment may result in desired repeater locations as indicated, for example, by the dots shown in FIG. 2. As can be seen, these repeaters are concentrated in clusters 60, 62, 64, and 66. This information is then used to determine an optimum repeater cell placement, such as shown in FIG. 3.

Figure 3:
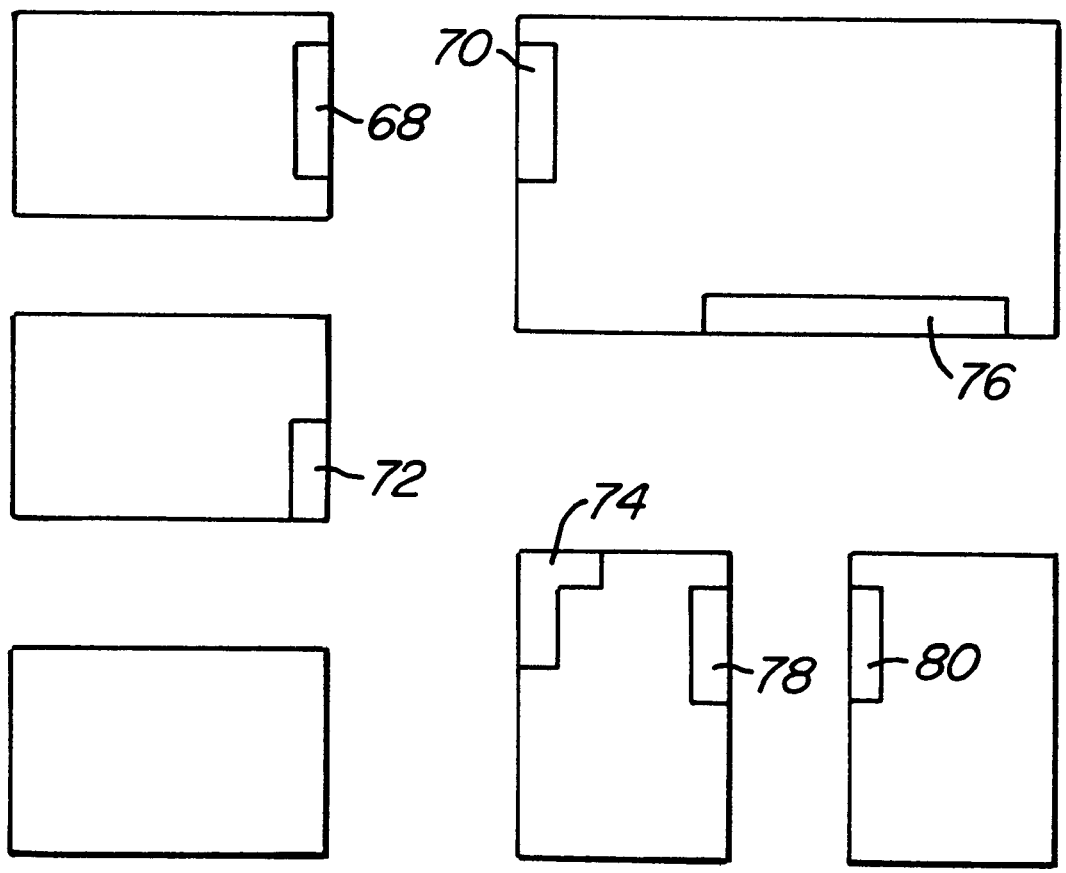
FIG. 3 is a diagram of the chip of FIG. 2 showing the assignment of repeater arrays according to a second step of an embodiment of the invention.

FIG. 3 shows the placement of arrays of repeater cells to put an optimum placement closest to the clusters shown in FIG. 2. For example, repeater arrays 68 and 70 would be adjacent cluster of 60 of FIG. 2, while repeater arrays 72 and 74 would be adjacent cluster 62, with array 76 adjacent cluster 64 and arrays 78 and 80 adjacent cluster 66.

In addition, the signal direction along the interconnect lines at the desired repeater locations can be analyzed to determine the optimal orientation of repeaters in the arrays. Thus, one array might have most repeaters going East to West, while another one might have most repeaters going North to South or West to East, for example. Additionally, the number of interconnect lines which can be routed through the internal portion of a block, as opposed to a channel, is determined. From this information, and the desired origin and destination of the interconnect lines, the orientation of repeaters in the arrays can be further modified. For example, instead of certain repeaters being oriented to minimize connection turns from a line going from the channel to the repeater and back to the channel, instead, the interconnect line would go to the repeater and through the block. This might require, for example, an East-West orientation instead of a North-South.

In addition, certain repeater cells can be configured as universal cells, allowing either North-South, East-West, or inverted orientations as needed. As a rule of thumb, one universal type repeater may be used for every twenty East-West or North-South repeaters on each side of a block. One preferred location for a universal cell is at the corner of a block, which obviously maximizes the ease of entrance points from East-West or North-South.

Figure 4:
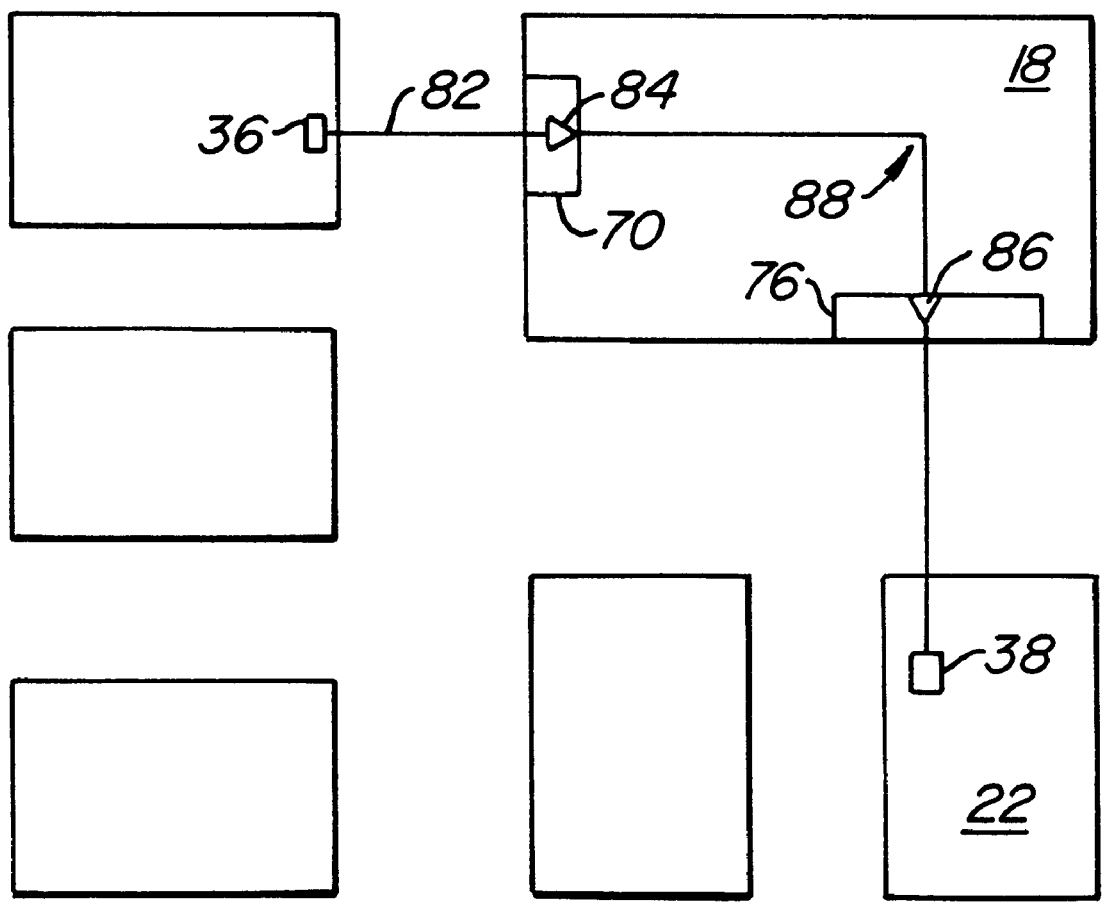
FIG. 4 is a diagram of the chip of FIG. 2 illustrating an example of a signal line through a block using the assigned repeater cells of FIG. 3.

FIG. 4 illustrates a rerouting of signal line 34 from FIG. 1. As shown, a new signal line 82 passes through a repeater 84 (in array 70 of FIG. 3), through the internal portion of block 18, to a repeater 86 (in array 76 from FIG. 3), and then through the internal portion of block 22 to receiver 38. As can be seen, only a single turn at a point 88 is required. This can be contrasted with the four L turns and two U turns of line 34 of FIG. 1. Even though only a portion of the interconnect lines may be passed through block 18 in this manner, the savings can be significant. This is particularly important for timing critical lines.

In a preferred embodiment, timing critical or other lines may be assigned a appropriate priority weighting to ensure that they receive the optimum routing. Thus, the automatic determination of which lines can go through the block will first route those with the highest weighting through the block. Lower weighting lines may have to go through the channels with multiple turns if the maximum number of routings through the block are used up.

Preferably, as shown in FIG. 3, the arrays of repeater blocks are positioned at the edges of the blocks, to minimize the distance of the signal lines interconnecting them to the interconnect lines. Preferably, these arrays have assigned a cushion number of extra repeaters, and extra universal repeaters. Since, in VLSI chip design, typically multiple iterations are performed with modifications to the circuitry, this allows for small changes without a complete rerouting and replacement of the repeater arrays. Such an iteration may require the moving of some lines and reassignment of repeaters. One modification may allow the "freezing" of the location of certain critical interconnect lines and their repeaters, so that any reshuffling is done of lesser priority lines.

As would be understood by those with skill in the art, the present invention may be embodied in other specific forms without departing from the spirit or essential characteristics thereof. Accordingly, the foregoing description is intended to be illustrative, but not limiting, of the scope of the invention which is set forth in the following claims.

What is claimed is:

1. A method of routing interconnect lines in a VLSI chip using repeaters, comprising the steps of:
    determining an optimal virtual assignment of repeater locations;
    identifying clusters of said optimal virtual locations;
    assigning arrays of repeaters to physical locations adjacent said clusters of optimal virtual locations; and
    determining an optimal global routing using said physical locations of said repeaters.

2. The method of claim 1 further comprising the steps of:
    identifying blocks of circuitry and routing channels on said VLSI chip; and
    routing a portion of said interconnect lines through at least one of said blocks that said portion of interconnect lines do not terminate in, where routing is possible, to reduce the number of turns in said interconnect lines.

3. The method of claim 2 further comprising the step of:
    assigning arrays of said repeaters to edges of said blocks adjacent said optimal virtual locations.

4. The method of claim 1 further comprising the steps of:
    determining a direction of signal flow at said optimal virtual repeater locations; and
    assigning arrays of said repeaters to said physical locations, each array having repeater cells with input and output configurations corresponding to said direction of signal flow.

5. The method of claim 2 further comprising the steps of:

assigning priority weights to certain ones of said interconnect lines; and assigning said portion of interconnect lines through at least one of said blocks in order of said priority weights.

6. A method of routing interconnect lines in a VLSI chip using repeaters, comprising the steps of:

determining an optimal virtual assignment of repeater locations;

identifying clusters of said optimal virtual locations;

determining a direction of signal flow at said optimal virtual repeater locations;

identifying blocks of circuitry and routing channels on said VLSI chip;

assigning said arrays of repeaters to edges of said blocks adjacent said optimal virtual locations, each array having repeater cells with input and output configurations corresponding to said direction of signal flow;

routing a portion of said interconnect lines through at least one of said blocks that said portion of interconnect lines do not terminate in, where routing is possible, to reduce the number of turns in said interconnect lines; and determining an optimal global routing using said physical locations of said repeaters.

7. The method of claim 6 further comprising the steps of:

assigning priority weights to certain ones of said interconnect lines; and assigning said portion of interconnect lines through at least one of said blocks in order of said priority weights.

8. A VLSI circuit comprising:

a plurality of lines, each extending from a driver to at least one load;

a plurality of repeaters connected to said lines;

at least some of said repeaters having been located at positions by determining an optimal virtual assignment of repeater locations;

identifying clusters of said optimal virtual locations;

assigning arrays of repeaters to physical locations adjacent said clusters of optimal virtual locations; and determining an optimal global routing using said physical locations of said repeaters.

9. A computer system comprising:

a memory;

a bus coupled to said memory;

a microprocessor coupled to said bus, said microprocessor including a plurality of lines, each from a driver to at least one load, a plurality of repeaters connected to said lines, and at least some of said repeaters having been located at positions by determining an optimal virtual assignment of repeater locations;

identifying clusters of said optimal virtual locations;

assigning arrays of repeaters to physical locations adjacent said clusters of optimal virtual locations; and determining an optimal global routing using said physical locations of said repeaters.

10. A computer program readable media comprising computer readable code embodied therein for causing a determination of repeater placement in a line between a driver and at least one load in a VLSI circuit, said code having instructions for determining an optimal virtual assignment of repeater locations;

identifying clusters of said optimal virtual locations;

assigning arrays of repeaters to physical locations adjacent said clusters of optimal virtual locations; and determining an optimal global routing using said physical locations of said repeaters.

* * * * *